(12) United States Patent
Phillips

(10) Patent No.: US 6,833,959 B2
(45) Date of Patent: Dec. 21, 2004

(54) COLOR SHIFTING CARBON-CONTAINING INTERFERENCE PIGMENTS

(75) Inventor: Roger W. Phillips, Santa Rosa, CA (US)

(73) Assignee: Flex Products, Inc., Santa Rosa, CA (US)

( * ) Notice: Subject to any disclaimer, the term of this patent is extended or adjusted under 35 U.S.C. 154(b) by 0 days.

(21) Appl. No.: 10/781,402

(22) Filed: Feb. 18, 2004

(65) Prior Publication Data

US 2004/0165272 A1 Aug. 26, 2004

Related U.S. Application Data

(62) Division of application No. 10/355,545, filed on Jan. 31, 2003, now Pat. No. 6,751,022, which is a division of application No. 09/420,717, filed on Oct. 20, 1999, now Pat. No. 6,545,809.

(51) Int. Cl.[7] .............................................. G02B 1/10
(52) U.S. Cl. ........................ 359/588; 359/883; 359/884
(58) Field of Search .............................. 359/588, 359, 359/883–884, 627; 428/450

(56) References Cited

U.S. PATENT DOCUMENTS

| | | |
|---|---|---|
| 3,011,383 A | 12/1961 | Sylvester et al. |
| 3,123,490 A | 3/1964 | Bolomey et al. |

(List continued on next page.)

FOREIGN PATENT DOCUMENTS

| | | |
|---|---|---|
| EP | 0472371 A1 | 2/1992 |
| JP | 55117106 | 9/1980 |
| JP | 61198201 | 9/1986 |
| JP | 61198201 A | 9/1986 |
| JP | 4-264513 | 9/1992 |
| JP | 11213335 | 8/1999 |
| WO | WO 96/22336 | 7/1996 |
| WO | WO 96/38505 | 12/1996 |
| WO | WO 98/12583 | 3/1998 |
| WO | WO 99/35194 | 7/1999 |

OTHER PUBLICATIONS

Barrett and Nix, *The Principles of Engineering Materials*, Prentice Hall, Inc., 282–290, 1973.

(List continued on next page.)

*Primary Examiner*—Mohammad Sikder
(74) *Attorney, Agent, or Firm*—Allen, Dyer, Doppelt, Milbrath & Gilchrist, P.A.

(57) ABSTRACT

A color shifting multilayer interference film is provided which may be used to produce foils or flakes for use in pigment compositions and colorants having color shifting properties. The flakes can be interspersed into a pigment medium to form paints, inks, or cosmetic preparations which can subsequently be applied to objects, papers, or people. Three and five layer designs of the interference film include alternating layers of a dielectric material and carbon in various configurations. The dielectric layers are formed to have an optical thickness at a design wavelength that provides a color shift as the angle of incident light or viewing angle changes.

16 Claims, 6 Drawing Sheets

U.S. PATENT DOCUMENTS

| | | |
|---|---|---|
| 3,412,575 A | 11/1968 | Feldman et al. |
| 3,622,473 A | 11/1971 | Ohta et al. |
| 3,926,659 A | 12/1975 | Bernhard et al. |
| 3,949,139 A | 4/1976 | Dunning et al. |
| 3,962,397 A | 6/1976 | Narui et al. |
| 3,988,494 A | 10/1976 | McAdow |
| 4,116,710 A | 9/1978 | Heikel |
| 4,168,983 A | 9/1979 | Vittands et al. |
| 4,213,886 A | 7/1980 | Turner |
| 4,309,075 A | 1/1982 | Apfel et al. |
| 4,321,087 A | 3/1982 | Levine et al. |
| 4,434,010 A | 2/1984 | Ash |
| 4,552,593 A | 11/1985 | Ostertag |
| 4,629,512 A | 12/1986 | Kondis |
| 4,705,300 A | 11/1987 | Berning et al. |
| 4,705,356 A | 11/1987 | Berning et al. |
| 4,721,217 A | 1/1988 | Phillips et al. |
| 4,756,771 A | 7/1988 | Brodalla et al. |
| 4,799,745 A | 1/1989 | Meyer et al. |
| 4,838,648 A | 6/1989 | Phillips et al. |
| 4,851,095 A | 7/1989 | Scobey et al. |
| 4,978,394 A | 12/1990 | Ostertag |
| 5,009,486 A | 4/1991 | Dobrowolski et al. |
| 5,059,245 A | 10/1991 | Phillips et al. |
| 5,084,351 A | 1/1992 | Phillips et al. |
| 5,116,664 A | 5/1992 | Kimura et al. |
| 5,135,812 A | 8/1992 | Phillips et al. |
| 5,171,363 A | 12/1992 | Phillips et al. |
| 5,190,807 A | 3/1993 | Kimock et al. |
| 5,198,042 A | 3/1993 | Masumoto et al. |
| 5,225,057 A | 7/1993 | LeFebvre et al. |
| 5,278,590 A | 1/1994 | Phillips et al. |
| 5,279,657 A | 1/1994 | Phillips et al. |
| 5,322,767 A | 6/1994 | Ohshima et al. |
| 5,356,471 A | 10/1994 | Reynders |
| 5,364,467 A | 11/1994 | Schmid et al. |
| 5,378,527 A | 1/1995 | Nakanishi et al. |
| 5,549,774 A | 8/1996 | Miekka et al. |
| 5,571,624 A | 11/1996 | Phillips et al. |
| 5,573,584 A | 11/1996 | Ostertag et al. |
| 5,593,773 A | 1/1997 | McKay et al. |
| 5,607,504 A | 3/1997 | Schmid et al. |
| 5,624,076 A | 4/1997 | Miekka et al. |
| 5,624,486 A | 4/1997 | Schmid et al. |
| 5,629,068 A | 5/1997 | Miekka et al. |
| 5,648,165 A | 7/1997 | Phillips et al. |
| 5,656,128 A | 8/1997 | Hashimoto et al. |
| 5,662,738 A | 9/1997 | Schmid et al. |
| 5,672,410 A | 9/1997 | Miekka et al. |
| 5,707,409 A | 1/1998 | Martin et al. |
| 5,763,086 A | 6/1998 | Schmid et al. |
| 5,766,334 A | 6/1998 | Hashizume et al. |
| 5,766,335 A | 6/1998 | Bujard et al. |
| 5,789,068 A | 8/1998 | King et al. |
| 5,790,304 A | 8/1998 | Sanders et al. |
| 5,830,567 A | 11/1998 | Panush |
| 5,858,078 A | 1/1999 | Andes et al. |
| 5,877,895 A | 3/1999 | Shaw et al. |
| 6,001,521 A | 12/1999 | Hashizume et al. |
| 6,013,370 A | 1/2000 | Coulter et al. |
| 6,114,018 A | 9/2000 | Phillips et al. |
| 6,246,523 B1 | 6/2001 | Bradley et al. |
| 6,304,427 B1 | 10/2001 | Reed et al. |
| 6,392,220 B1 | 5/2002 | Slater et al. |

OTHER PUBLICATIONS

Callister WD, Jr., *Materials Science and Engineering: An Introduction*, John Wiley & Sons, Inc., 91–112, 1985.

Zink, et al., *Optical Probes and Properties of Aluminosilicate Glasses Prepared by the Sol–Gel Method*, Polymer Material Science and Engineering, 61, 204–208, 1989.

McKiernan et al, *Luminescence and Laser Action of Coumarin Dyes Doped in Silicate and Aluminosilicate Glasses Prepared by the Sol–Gel Technique*, Journal of Inorganic Organometallic Polymers, vol. 1, No. 1, 87–103, 1991.

Greiwe K., *Coloured Aluminum Pigments*, Eckart–Werke, Werk Güntersthal, 4$^{th}$ Nürnberg Congress, Paper 6, 1–7.

The Mearle Corporation brochure for "*Mearle Iridescent Film,*" Peekskill, New York.

J.A. Dobrowolski; K.M. Baired; P.D. Carman; and A. Waldof, "*Optical Interference Coatings for Inhibiting of Counterfeiting,*" Optica Acta, 1973, vol. 20, No. 12, 925–937.

The R.D. Mathis Company Manual for "*Think Film Evaporation Source Reference,*" Long Beach, CA.

Minolta Manual for "*Precise Color Communication, Color Control From Feeling to Instrumentation,*" pp. 18, 20, 22, 23, 46, 47, 48 and 49.

R. Hermann and G. Braüer, "*DC and RF–Magnetron Sputtering,*" and J. Becker, "*Ion Beam Sputtering,*" Handbook of Optical Properties, vol. 1, pp. 135–212, R.E. Hummel and K.H. Guenter (eds), CRC Press (1995).

D.G. Teer, "*Reactive Magnetron Sputter Barrel Ion Plating,*" Conference Proceedings IPAT 91, p. 303–308, Brussels, Belgium.

C. Window and N. Savvides, "*Charged Particle Fluxes From Planar Magnetron Sputtering Sources,*" J. Vac. Sci. Technol. A 4(2), Mar./Apr. 1986, p. 196–202.

N. Savvides and B. Window, "*Unbalanced Magnetron Ion–Assisted Deposition and Property Modification of Thin Films,*" J. Vac. Sci. Technol. A 4(3), May/Jun. 1986, p. 504–508.

B. Window, F. Sharples, and N. Savvides, "*Magnetically Confined Sputter Source with High Ion Flux,*" J, . Vac. Sci. Technol. A 3(6), Nov./Dec. 1985, p. 2368–2372.

N.A.G. Ahmed and D.G, Teer, "*A Simple and Inexpensive Rotating Barrel to Ion Plate Small Components,*" J. Phys. E.Sci.Instrum., vol. 17, 1984, p. 411–416.

Myong Ryeong Kim, "*Magnetron Sputter Deposited CoPtCr Magnetic Thin Films for Information Storage,*" Ph.D. Dissertion Thesis, Department of Metallurgical Engineering, The University of Utah, Jun. 1993.

Rancourt, James D., *Optical Thin Films User's Handbook*, p. 4, 1987.

Pearl Lustre Pigments, Physical Principles, Properties, Applications, *Merck*, pp. 30–35, 1992.

COLOR SHIFTING CARBON-CONTAINING INTERFERENCE PIGMENTS

CROSS-REFERENCE TO RELATED APPLICATIONS

This application is a divisional of application Ser. No. 10/355,545 filed on Jan. 31, 2003, now U.S. Pat. No. 6,751,022 which is a divisional of application Ser. No. 09/420,717, filed on Oct. 20, 1999, now U.S. Pat. No. 6,545,809, both of which are incorporated herein in their entirety and to which priority is claimed.

BACKGROUND OF THE INVENTION

1. The Field of the Invention

The present invention is related generally to thin film optical coatings for producing color. More specifically, the present invention is related to multilayer thin film interference coatings or flakes which exhibit color shifting properties with changes in angle of incident light or in viewing angle

2. The Relevant Technology

Color shifting pigments and colorants have been used in numerous applications, ranging from automobile paints to anti-counterfeiting inks for security documents and currency. Such pigments and colorants exhibit the property of changing color upon variation of the angle of incident light, or as the viewing angle of the observer is shifted. The primary method used to achieve such color shifting colorants is to disperse small flakes, which are typically composed of multiple layers of thin films having particular optical characteristics, throughout a medium such as paint or ink that may then be subsequently applied to the surface of an object.

The color shifting properties of the colorant can be controlled through proper design of the optical coatings or films used to form the flakes. Desired effects can be achieved through the variation of parameters such as thickness of the layers forming the flakes and the index of refraction of each layer. The changes in perceived color which occur for different viewing angles or angles of incident light are a result of a combination of selective absorption of the materials comprising the layers and wavelength dependent interference effects. The absorption characteristics of a material as well as interference phenomena are responsible for the basic color which is observed. The interference effects, which arise from the superposition of the light waves that have undergone multiple reflections and transmissions within the multilayered thin film structure, are responsible for the shifts in perceived color with different angles.

Examples of color shifting thin films are disclosed in U.S. Pat. No. 4,705,356 to Berning et al. In one embodiment therein, a three layer metal(1)-dielectric-metal(2) stack is disclosed in which metal(1) is a relatively thin, highly absorptive material, metal(2) is a highly reflecting, essentially opaque metal, and the dielectric is a low index of refraction material. In an alternative embodiment, an all-dielectric stack is disclosed. These designs, however, require the use of so-called subtractive colorant carrying superstrates which utilize dyes to achieve the desired colors.

Further improvements in the optical characteristics of thin film flakes which may be used in paints and inks such as for anti-counterfeiting applications are disclosed in U.S. Pat. No. 5,135,812 to Phillips et al. According to this patent, a symmetrical optical multilayer film is composed either of transparent all-dielectric stacks, or transparent dielectric and semi-transparent metallic layered stacks with an opaque reflector in the center of an optical stack. In the case of an all-dielectric stack, the optical coating is made of alternating layers of high and low refractive index materials. Suitable materials disclosed are zinc sulfide or titanium dioxide for the high index layers, and magnesium fluoride or silicon dioxide for the low index layers.

In U.S. Pat. No. 5,278,590 to Phillips et al., a symmetric three layer optical interference coating is disclosed which comprises first and second partially transmitting absorber layers which have essentially the same composition and thickness, and a dielectric spacer layer located between the first and second absorber layers. The dielectric layer is composed of a material having a low index of refraction such as magnesium fluoride.

High chroma interference platelets for use in paints, including color shifting and nonshifting single color platelets, are disclosed in U.S. Pat. No. 5,571,624 to Phillips et al. These platelets are formed from a symmetrical multilayer thin film structure in which a first semi-opaque layer such as chromium is formed on a substrate, with a first dielectric layer formed on the first semi-opaque layer. An opaque reflecting metal layer such as aluminum is formed on the first dielectric layer, followed by a second dielectric layer of the same material and thickness as the first dielectric layer. A second semi-opaque layer of the same material and thickness as the first semi-opaque layer is formed on the second dielectric layer. For the color shifting designs, the dielectric materials utilized have an index of refraction less than 2.0. For the nonshifting designs, the dielectric materials are selected to have an index of refraction greater than 2.0.

The prior color shifting interference films and platelets which can be used in pigment compositions such as those discussed above typically include metal reflector and absorber layers. In order to utilize such pigment compositions in the broadest variety of applications, it is desirable to eliminate metals which might be environmentally unstable, or otherwise reactive with a paint, ink, or other organic vehicle. While a wide variety of metals or metal compounds may be utilized to form pigments exhibiting color shifts, it is desirable to provide pigment products which are substantially devoid of metals or metal compounds, which are especially suspect for toxic effects in food contact applications or other applications with a potential for exposure to human tissue.

SUMMARY AND OBJECTS OF THE INVENTION

It is an object of the invention to provide color shifting multilayer interference films that can be formed into interference flakes for use as a pigment or formed into foils.

A further object of the invention is to provide color shifting interference films, foils, and flakes which have substantial shifts in chroma and hue with a varying angle of view.

It is yet another object of the invention to provide color shifting interference flakes which may be easily and economically utilized in colorants such as paints and inks for various applications.

An additional object of the invention is to provide color shifting pigment compositions that are substantially free of metals and metal compounds.

To achieve the forgoing objects and in accordance with the invention as embodied and broadly described herein, a color shifting carbon-containing multilayer interference film is provided which may be used to produce flakes for use in pigment compositions or to produce foils having color shifting properties. The flakes can be interspersed into various pigment media such as paints, inks, or cosmetic preparations, for subsequent application to objects, papers, or people to achieve color variations upon changes in angle of incident light or viewing angle. The foils can be adhered directly to objects to provide color shifting properties.

Three and five layer designs of the interference film include alternating layers of a dielectric material and carbon in various configurations. The dielectric layers are formed to have an optical thickness at a design wavelength that provides a color shift as the angle of incident light or viewing angle changes.

In a method of fabricating a color shifting interference film according to the present invention, the carbon and dielectric layers are formed on a web material by conventional deposition processes to produce a particular film design. The film is then removed from the web material in the form of flakes or as a foil. The flakes can then be dispersed in a pigment medium to produce a color shifting pigment composition such as a color shifting paint, ink, or cosmetic preparation.

Alternatively, a color shifting interference pigment can be made by forming a first layer of a carbon or dielectric material on an upper surface of a web material, and removing the first layer from the web material in order to produce a plurality of flakes. The flakes are then coated with one or more additional layers of carbon or dielectric material that substantially surround the flakes, with the adjacent additional layer being formed of a different material than the fist layer.

These and other aspects and features of the present invention will become more fully apparent from the following description and appended claims, or may be learned by the practice of the invention as set forth hereinafter.

BRIEF DESCRIPTION OF THE DRAWINGS

In order to more fully understand the manner in which the above-recited and other advantages and objects of the invention are obtained, a more particular description of the invention will be rendered by reference to specific embodiments thereof which are illustrated in the appended drawings. Understanding that these drawings depict only typical embodiments of the invention and are not therefore to be considered as limiting of its scope, the invention will be described and explained with additional specificity and detail through the use of accompanying drawings in which.

DETAILED DESCRIPTION OF THE INVENTION

Figure 1:
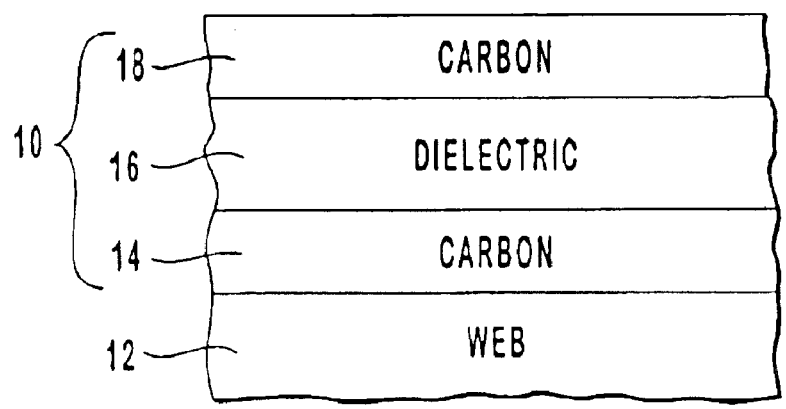
FIG. 1 is a schematic depiction of a three layer color shifting interference film according to one embodiment of the present invention.

The present invention is directed to multilayer interference films which may be used to produce flakes or foils having color shifting properties. The flakes can be interspersed into various pigment media such as paints, inks, or cosmetic preparations, for subsequent application to objects, papers, or people to achieve color variations upon changes in angle of incident light or viewing angle by an observer.

The thin film layers described herein are typically made by methods well known in the art of forming thin coating structures, such as by physical vapor deposition (PVD) methods or chemical vapor deposition (CVD) methods. As discussed in greater detail below, the coating structure is formed on a substrate such as a flexible web and is removed therefrom as thin film flakes, which can be added to a liquid medium such as various pigment vehicles for use as a colorant with color shifting properties. A collection of such thin film flakes added to a liquid medium produces a predetermined optical response from visible radiant energy incident on a surface of the solidified medium. Alternatively, the coating structure can be removed from the web in the form of foils.

Generally, a foil is an asymmetric optical stack since the foil configuration is typically used as a hot stamping foil where the substrate is removed from the optical stack by a heat activated adhesive. The adhesive can be either coated to the backside of the optical stack or applied in the form of a UV activated adhesive to the surface to which the optical stack or foil will be affixed. Further details of making and using optical stacks as hot stamping foils can be found in U.S. Pat. No. 5,648,165, the disclosure of which is incorporated herein by reference. Alternatively, the foil configuration can be used with the substrate attached to the optical stack. A particularly useful embodiment of an optical stack affixed to a substrate is described in copending U.S. patent application Ser. No. 09/351,102, filed on Jul. 8, 1999, and entitled "DIFFRACTIVE SURFACES WITH COLOR SHIFTING BACKGROUNDS" which is incorporated herein by reference, wherein a holographic optical element is formed on at least one of the substrate surfaces.

In contrast, pigment flakes must have a symmetrical coating structure so that the color is the same for either way the flakes are oriented to the observer. In this case, the coating structure is made of a symmetrical optical stack so that when the optical stack is removed from the substrate as platelets or flakes (i.e., a pigment) the pigment flakes have the same color on both sides.

Various forms of carbon can be utilized in the present invention, including but not limited to, graphitic, carbonaceous, and amorphous carbon; vitreous carbon; diamond-like carbon; amorphous hydrogenated carbon such as amorphous hydrogenated diamond-like carbon; carbon compounds; various combinations thereof, and the like. Other forms of carbon with different optical properties resulting from the method of deposition can also be utilized, such as arc evaporated carbon, ion assisted carbon I, ion assisted carbon II, and the like.

The carbon film layers in the flakes and foils of the invention have a refractive index (n) from about 1 to about 2.6. Preferably, at least one of the carbon layers has a refractive index greater than about 1.5, more preferably greater than about 1.75, and most preferably greater than about 2. The carbon film layers have an absorption coefficient ($\alpha$) greater than about 0.02, preferably greater than about 0.1, more preferably greater than about 1, and most preferably greater than about 2. Ideally, the refractive index and absorption coefficient values are nearly equal, such that the ratio of refractive index to absorption coefficient ($n/\alpha$) is about 1. Preferably, at least one of the carbon layers in the flakes or foils has an absorption coefficient such that the ratio of refractive index to absorption coefficient is from about 0.1 to about 10, more preferably from about 0.5 to about 5, and most preferably from about 0.75 to about 1.25. The range of optical constants for various forms of carbon are summarized in Tables 3–9 below and compared in Example 6.

This invention is based on the discovery that a multi-layer optical stack of carbon and a dielectric material can be used to produce colored interference pigments with substantial color shift or flop properties. The present film structure differs from prior interference films by the absence of the combination of both a high and low refractive index dielectric layer, as well as metal reflector and metal absorber layers. While not wishing to be bound by any theory, it is believed that the carbon layers of the optical stack act as both a high index material and an absorber, and work in conjunction with the dielectric layers to produce color shifting effects.

Referring to the drawings, wherein like structures are provided with like reference designations, FIG. 1 depicts one embodiment of a three layer coating design in the form of an interference film 10 having color shifting characteristics. The film 10 is formed on a web 12 of a flexible material such as a polyester material (e.g., polyethylene terephthalate or PET). The film 10 has a first carbon layer 14, a first dielectric layer 16 on carbon layer 14, and a second carbon layer 18 on dielectric layer 16. Each of these layers of film 10 will be discussed in further detail below.

The web 12 can be employed in a conventional roll coater apparatus and typically a release layer (not shown) of a suitable type is formed on an upper surface of web 12 prior to deposition of the interference film coating layers. The release layer allows interference film 10 to be removed as thin flakes or foils from web 12. The release layer may be an organic solvent soluble or water soluble coating such as acrylic resins, cellulosic propionates, (polyvinyl pyrrolidine) polyvinyl alcohol or acetate, and the like.

The first carbon layer 14 of interference film 10 is deposited on web 12 by a conventional deposition process such as electron beam evaporation, sputtering, or by hydrocarbon CVD reactions to form a layer of carbon. The carbon layer 14 is formed to have a suitable physical thickness from about 25 to about 1000 Angstroms (Å), preferably from about 200–500 Å, and more preferably from about 200–300 Å. When a PVD process is used, the carbon layer 14 can be formed from various carbon sources such as graphite, poco, or vitreous carbon.

Alternatively, the various forms of carbon can be deposited by a variety of CVD processes, such as those more fully described in U.S. Pat. No. 5,190,807, the disclosure of which is incorporated herein by reference. Additionally, useful forms of carbon and carbon compounds such as silicon oxycarbide, $SiO_x$ containing carbon black, combinations thereof, and the like, can be utilized. These carbon compounds can be deposited by methods described in U.S. Pat. No. 5,356,471, the disclosure of which is incorporated herein by reference.

In further alternative methods, the carbon film layers can be formed by modification of solid polymeric thin films, such as those composed of polyarylates, polyacrylonitrile, parylene, and the like, which have a high aromatic content. Such carbon films are formed by deposition of a solid polymer film and the subsequent conversion of the polymer film to a carbon film by an energetic process, such as thermal pyrolysis, ion bombardment, or the like.

The first dielectric layer 16 is then formed on carbon layer 14 by a conventional deposition process such as PVD, or by an $SiO_2$ Sol-gel process as more fully described in U.S. Pat. No. 5,858,078, the disclosure of which is incorporated herein by reference.

The dielectric layer 16 is formed to have an effective optical thickness for imparting color shifting properties to interference film 10. The optical thickness is a well known optical parameter defined as the product nd, where n is the refractive index of the layer and d is the physical thickness of the layer. Typically, the optical thickness of a layer is expressed in terms of a quarter wave optical thickness (QWOT) which is equal to $4nd/\lambda$, where $\lambda$ is the wavelength at which a QWOT condition occurs. The dielectric layer 16 is formed to have an optical thickness of a plurality of quarterwaves at a particular design wavelength. The optical thickness can range from about 2 QWOT to about 9 QWOT at a design wavelength of about 400–700 nm, and preferably from about 2 QWOT to about 6 QWOT at a design wavelength of about 400–600 nm. The physical thickness of dielectric layer 16 is thus in a range from about 138 nm to about 1086 nm, and preferably from about 140 nm to about 725 nm.

The dielectric material utilized to form dielectric layer 16 can have a "low" index of refraction, which is defined herein as an index of refraction of about 1.65 or less, or can have a "high" index of refraction, which is defined herein as an index of refraction of greater than about 1.65. Preferably, the dielectric materials utilized have an index of refraction from about 1.38 to about 2.3. Various dielectric materials that can be utilized include inorganic materials such as metal oxides, metal fluorides, metal sulfides, metal nitrides, metal carbides, combinations thereof, and the like, as well as organic dielectric materials. These materials are readily available and easily applied by physical or chemical vapor deposition processes.

Nonlimiting examples of suitable low index dielectric materials that can be used include silicon dioxide ($SiO_2$), aluminum oxide ($Al_2O_3$), and metal fluorides such as magnesium fluoride ($MgF_2$), aluminum fluoride ($AlF_3$), cerium fluoride ($CeF_3$), lanthanum fluoride ($LaF_3$), sodium aluminum fluorides (e.g., $Na_3AlF_6$ or $Na_5Al_3F_{14}$), neodymium fluoride ($NdF_3$), samarium fluoride ($SmF_3$), barium fluoride ($BaF_2$), calcium fluoride ($CaF_2$), lithium fluoride ($LiF$), combinations thereof, or any other low index material having an index of refraction of about 1.65 or less. For example, organic monomers and polymers can be utilized as low index materials, including dienes or alkenes such as acrylates (e.g., methacrylate), polymers of perfluoroalkenes, polytetrafluoroethylene (TEFLON), polymers of fluorinated ethylene propylene (FEP), parylene, p-xylene, combinations thereof, and the like. Additionally, the foregoing materials include evaporated, condensed and cross-linked transparent acrylate layers, which may be deposited by methods described in U.S. Pat. No. 5,877,895, the disclosure of which is incorporated herein by reference.

Suitable high index dielectric materials include zinc sulfide (ZnS), zinc oxide (ZnO), zirconium oxide ($ZrO_2$), titanium dioxide (TiO$_2$), indium oxide (In$_2$O$_3$), indium-tin-oxide (ITO), tantalum pentoxide (Ta$_2$O$_5$), ceric oxide (CeO$_2$), yttrium oxide (Y$_2$O$_3$), europium oxide (Eu$_2$O$_3$), iron oxides such as (II)diiron(III) oxide (Fe$_3$O$_4$) and ferric oxide (Fe$_2$O$_3$), hafnium nitride (HfN), hafnium carbide (HfC), hafnium oxide (HfO$_2$), lanthanum oxide (La$_2$O$_3$), magnesium oxide (MgO), neodymium oxide (Nd$_2$O$_3$), praseodymium oxide (Pr$_6$O$_{11}$), samarium oxide (Sm$_2$O$_3$), antimony trioxide (Sb$_2$O$_3$), silicon carbide (SiC), silicon monoxide (SiO), silicon nitride (Si$_3$N$_4$), selenium trioxide (Se$_2$O$_3$), tin oxide (SnO$_2$), tungsten trioxide (WO$_3$), combinations thereof, and the like.

Preferred dielectric materials for use in the present invention include SiO$_x$ materials such as silicon dioxide, silicon monoxide, and combinations thereof, where x is between 1 and 2. The SiO$_2$ layers can be formed by depositing SiO in the presence of an O$_2$ atmosphere. Other preferred dielectric materials include MgF$_2$, Al$_2$O$_3$, and combinations thereof.

The second carbon layer 18 of interference film 10 is deposited on dielectric layer 16 by a conventional deposition process such as PVD to complete the three layer interference film 10. The carbon layer 18 can be formed from the same source and at the same thicknesses as discussed above for carbon layer 16. The film 10 is then subsequently removed from web 12 in the form of a plurality of color shifting interference flakes, which can be added to a pigment medium for use as a colorant with color shifting properties. The pigment medium can include various polymeric compositions or organic binders such as, acrylic melamine, urethanes, polyesters, vinyl resins, acrylates, methyl methacrylate, ABS resins, epoxies, styrenes, mixtures thereof, as well as others well known to those skilled in the art such as ink and paint formulations, especially those based on alkyd resins. Alternatively, the film 10 can be removed from web 12 in the form of a hot stamp foil. An additional alternative is to keep a substrate in contact with the optical stack for use in anti-counterfeit labels, as for example.

Figure 2:
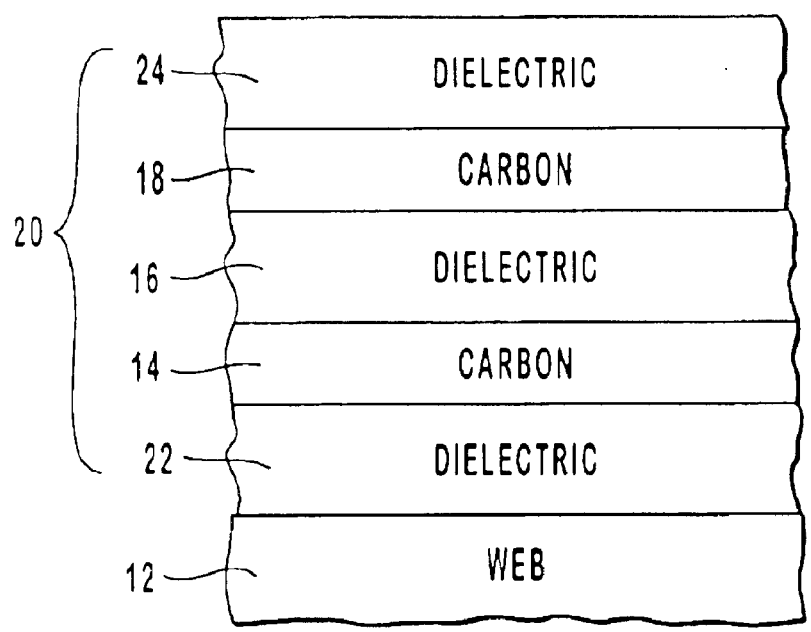
FIG. 2 is a schematic depiction of a five layer color shifting interference film according to another embodiment of the present invention.

FIG. 2 depicts a five layer coating design in the form of an interference film 20 having color shifting characteristics according to another embodiment of the invention. The film 20 has a three layer internal coating structure that corresponds to film 10, including a carbon layer 14, a first dielectric layer 16, and another carbon layer 18. This internal coating structure is interposed between a second dielectric layer 22 and a third dielectric layer 24. The carbon and dielectric layers of film 20 can be formed from the same materials and in the same thickness ranges as discussed above for film 10.

The film 20 is fabricated by forming dielectric layer 22 on a web 12 by a conventional deposition process such as PVD, followed by deposition of carbon layer 14, dielectric layer 16, and carbon layer 18. The dielectric layer 24 is then formed on carbon layer 18 by a deposition process to complete film 20. The film 20 is then removed from web 12 in order to produce a plurality of interference flakes, which can be added to a pigment medium for use as a colorant with color shifting properties, or a plurality of foils.

Figure 3:
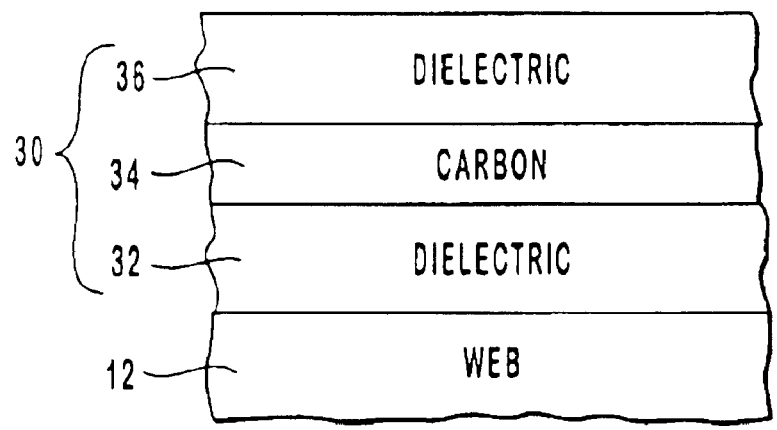
FIG. 3 is a schematic depiction of a three layer color shifting interference film according to an alternative embodiment of the present invention.

FIG. 3 depicts a three layer coating design in the form of an interference film 30 having color shifting characteristics according to an alternative embodiment of the invention. The film 30 includes a first dielectric layer 32, a carbon layer 34 on dielectric layer 32, and a second dielectric layer 36 on carbon layer 34. The carbon and dielectric layers of film 30 can be formed from the same materials and in the same thickness ranges as discussed above for film 10.

The film 30 is fabricated by forming dielectric layer 32 on a web 12 by a conventional deposition process, followed by deposition of carbon layer 34 and dielectric layer 36. The film 30 is then removed from web 12 in order to produce a plurality of interference flakes or foils.

It should be noted that when SiO$_2$ or another dielectric material with a similar refractive index is used to form the dielectric layers in film 30, the film will generally exhibit a reduced function as a color shifting pigment in paint or ink. This is because if the film were to be ground into a pigment and put into a pigment medium to form a paint or ink, the SiO$_2$ layers would have nearly the same refractive index as the medium to a close approximation, leaving the ink or paint a grayish color of carbon. However, if a higher refractive index material were chosen for the dielectric layers, the color would still result because of the difference in refractive indices from the outer dielectric layers and the surrounding pigment medium. Further, if a higher refractive index medium were used, then SiO$_2$ or another dielectric material having a lower refractive index than the medium might be preferred, in order to obtain the greatest difference in refractive index between the outer layer of the flake and the medium.

In contrast, although the embodiment of film 20 shown in FIG. 2 would index match in the same manner as film 30, if SiO$_2$ dielectric layers were used, the core optical structure C/SiO$_2$/C of film 20 would remain as an interference functional unit to give color. In this case, the outer SiO$_2$ layers would function as a protective layer for the core optical structure C/SiO$_2$/C. In a paint or ink composition that may be subjected to abrasion in a delivery system, the SiO$_2$ outer layers would prevent abrasion to the core optical structure that gives rise to color. Thus, the color in the paint or ink composition would be more durable.

Figure 4:
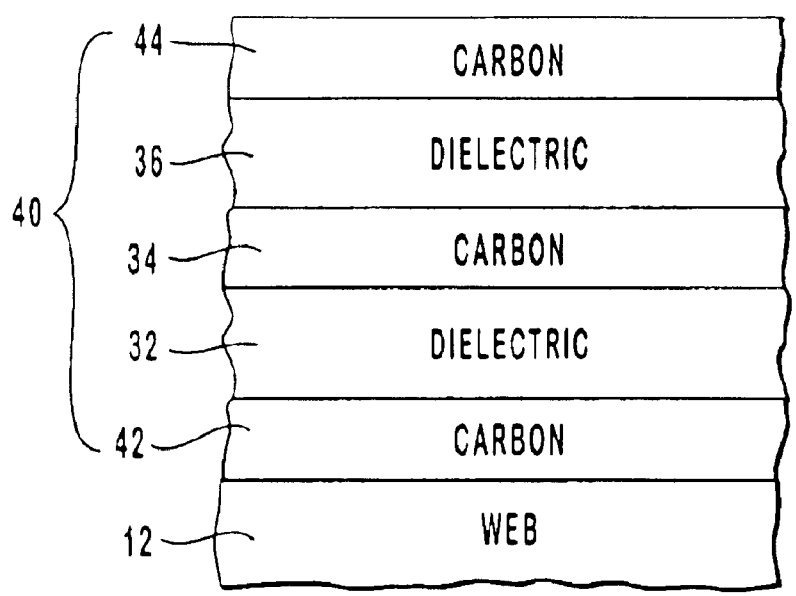
FIG. 4 is a schematic depiction of a five layer color shifting interference film according to a further embodiment of the present invention.

FIG. 4 depicts a five layer coating design in the form of an interference film 40 having color shifting characteristics according to another embodiment of the invention. The film 40 has a three layer internal coating structure that corresponds to film 30, including a dielectric layer 32, a first carbon layer 34, and another dielectric layer 36. This internal coating structure is interposed between a second carbon layer 42 and a third carbon layer 44. The carbon and dielectric layers of film 40 can be formed from the same materials and in the same thickness ranges as discussed above for film 10.

The film 40 is fabricated by forming carbon layer 42 on a web 12 by a conventional deposition process, followed by deposition of dielectric layer 32, carbon layer 34, and dielectric layer 36. The carbon layer 44 is then formed on dielectric layer 36 by a deposition process to complete film 40. The film 40 is then removed from web 12 in order to produce a plurality of interference flakes, which can be added to a pigment medium for use as a colorant, or a plurality of foils.

After a multilayer interference film of the types shown in FIGS. 1–4 has been formed on web 12, the interference film can be removed from web 12 by use of a solvent to form flakes or platelets which are sized to have a dimension on any surface thereof ranging from about 2 to about 200 microns. The flakes can be further reduced in size as desired. For example, the flakes can be subjected to an air grind to reduce their size to about 2–5 microns without destroying their desirable color characteristics. The color shifting flakes can then be dispersed into a pigment medium such as a paint, ink, or cosmetic preparation for use in a conventional manner.

Alternatively, a color shifting interference pigment can be made according to the present invention by forming at least one first layer of a carbon or dielectric material on an upper surface of a web material, and removing the first layer from the web in order to produce a plurality of flakes. The flakes are then coated with one or more additional layers of carbon or dielectric material that substantially surround the flakes, with the adjacent additional layer being formed of a different material than the first layer. For example, a flake structure such as shown in FIG. 1 formed by this method would include a dielectric layer 16, with carbon layers 14 and 18 forming a substantially continuous carbon coating surrounding dielectric layer 16. The flake structure such as shown in FIG. 2 formed by this method would include dielectric layers 22 and 24 forming a substantially continuous coating surrounding the carbon coating. In the alternative, a film 10, such as shown in FIG. 1, could be formed on a web and removed as flakes, with dielectric layers 22 and 24 forming a substantially continuous coating surrounding the flakes. Similarly, the flake structure shown in FIG. 3 formed by this method would include a carbon layer 34, with dielectric layers 32 and 36 forming a substantially continuous dielectric coating surrounding carbon layer 34. The flake structure such as shown in FIG. 4 formed by this method would include carbon layers 42 and 44 forming a substantially continuous coating surrounding the dielectric coating. In the alternative, a film 30, such as shown in FIG. 3, could be formed on a web and removed as flakes, with carbon layers 42 and 44 forming a substantially continuous coating surrounding the flakes.

In a further alternative embodiment to that shown in FIG. 4, interference flakes formed from film 30 of FIG. 3 can be coated with an additional dielectric layer which substantially surrounds dielectric layers 32 and 36, with the additional dielectric layer having a refractive index that is different from the refractive index of dielectric layers 32 and 36.

Suitable methods for coating the flakes with one or more layers are described in copending U.S. patent application Ser. No. 09/389,962, filed on Sep. 3, 1999, and entitled "METHODS AND APPARATUS FOR PRODUCING ENHANCED INTERFERENCE PIGMENTS" which is incorporated herein by reference.

The color shifting flakes can optionally be blended with other pigment flakes, particles, or dyes of different hues, chroma and brightness to achieve the color characteristics desired. For example, the flakes of the invention can be mixed with other conventional pigments, either of the interference type or noninterference type, to produce a range of other colors. The flakes of the invention can be combined with non-shifting high chroma or highly reflective platelets to produce unique color effects, such as $MgF_2/Al/MgF_2$ platelets or $SiO_2/Al/SiO_2$ platelets. Other suitable additives that can be mixed with the pigment compositions of the invention include lamellar pigments such as aluminum flakes, graphite flakes, glass flakes, iron oxide flakes, boron nitride flakes, mica flakes, interference based $TiO_2$ coated mica flakes, interference pigments based on multiple coated platelike silicatic substrates, metal-dielectric or all dielectric interference pigments, and the like, as well as non-lamellar pigments such as aluminum powder, carbon black, ultramarine blue, cobalt based pigments, organic pigments or dyes, rutile or spinel based inorganic pigments, naturally occurring pigments, inorganic pigments such as titanium dioxide, talc, china clay, and the like, as well as various mixtures thereof. For example, pigments such as aluminum powder or carbon black can be added to control lightness and other color properties.

By using the coating designs of the invention as shown in FIGS. 1–4, high chroma colorants can be produced in which variable color effects are noticeable to the human eye. Thus, an object colored with a paint containing the color shifting flakes of the invention will change color depending upon variations in the viewing angle or the angle of the object relative to the viewing eye. While all of the coating designs of the invention have color-shifting properties as the angle of view changes, coating designs with lower index dielectric materials tend to have the most color flop or color change.

The color characteristics of a colorant are achieved by utilizing a collection of thin film flakes of high chroma according to the invention which produce predetermined optical responses to radiation incident on the surfaces of the flakes. The color shifting flakes of the invention have a wide range of color shifting properties, including large shifts in chroma (degree of color purity) and also large shifts in hue (relative color) with a varying angle of view. By way of example, pigment compositions utilizing the interference flakes according to the invention can have color shifts such as magenta-to-green, gold-to-green, gold-to-cyan, etc.

The color shifting flakes of the invention can be easily and economically utilized in colorants such as paints and inks for various applications to objects and papers. Examples of such objects and papers include motorized vehicles, currency and security documents, household appliances, architectural structures, flooring, sporting goods, electronic packaging/housing, toys, etc.

In addition, the carbon based interference pigments and foils of the present invention are optimally suited for use in applications where a metal or a metallic compound would be either environmentally unstable, or be otherwise undesirable due to regulatory restraints arising from the inherent toxicity of the metal or metal compound and the nature of the application.

The following examples are given to illustrate the present invention, and are not intended to limit the scope of the invention.

EXAMPLE 1

A color shifting interference film having a five layer design was fabricated according to the present invention by depositing a first dielectric layer composed of $SiO_x$ (4 QWOT at 615 nm) on a 2 mil polyester web hardcoated with an organic release layer. Upon the first dielectric layer was deposited a carbon layer having a thickness of 250 Å, followed by a second dielectric layer of $SiO_x$ (4 QWOT at 615 nm). Thereafter, another carbon layer having a thickness of 250 Å was deposited on the second dielectric layer, followed by deposition of a third dielectric layer of $SiO_x$ (4 QWOT at 615 nm). Accordingly, the coating design of the film was $SiO_x/C/SiO_x/C/SiO_x$.

The $SiO_x$ ($SiO_2$) layers were formed by electron beam deposition in an oxygen atmosphere at $2 \times 10^{-4}$ torr. The carbon layers were formed by electron beam deposition at a pressure of $1 \times 10^{-5}$ torr or less using an electron gun current of 0.3–0.4 A at a voltage of 7 kv using a crucible made of copper. In both the $SiO_x$ and carbon depositions the distance from the source to the substrate was 76 cm.

The film material was released from the polyester web by dissolving the hardcoat with an acetone spray. This produced a plurality of flakes with the above coating design as the hardcoat dissolved away from the polyester web. These flakes, while still in the acetone liquid, were ground to size by placing the tip of a Branston ultrasonic horn into the liquid. After several minutes, the grinding procedure was stopped. The flakes were filtered from the solvent, and then redispersed in an acrylic melamine binder at approximately 25 wt-% to form a paint. This paint was then sprayed out onto a metal panel for color characterization.

Using a Zeiss color-measuring instrument equipped with multi-angle geometries, the color parameters of the painted metal panel were measured as a function of viewing angle from the gloss angle. Chroma values ranged from 36 to 67 as the angle changed. The color of the painted metal panel was magenta at normal incidence viewing, and moved into red and then to yellow and finally to green at very high reflective angles.

It was found that because the carbon based interference designs are somewhat transparent, the color properties of a paint sample incorporating these carbon based pigments are good because of the additive effect of one pigment overlying another. In other words, the color properties of an anchor paint sample incorporating such pigments are superior to that of the single flake foil from which the pigment was made.

EXAMPLE 2

A color shifting interference film having a five layer design was fabricated according to the procedure described in Example 1, except that in the coating design the $SiO_2$ layers were 4 QWOT at 515 nm in all three layers. The carbon layers had a thickness of 250 Å. The flakes produced from this film were dispersed in an acrylic melamine binder to form a paint, which was sprayed out onto a metal panel for color characterization. A clear spray overcoat was then applied to portions of the painted metal panel.

The color of the painted metal panel was gold at normal incidence viewing, and shifted to a cyan color at about a 45 degree angle of view.

Color characterization on the Zeiss instrument showed the painted metal panel to have chroma values of about 50–55, with higher chroma values of 55–60 for those areas that were covered with the clear spray overcoat.

EXAMPLE 3

Figure 5:
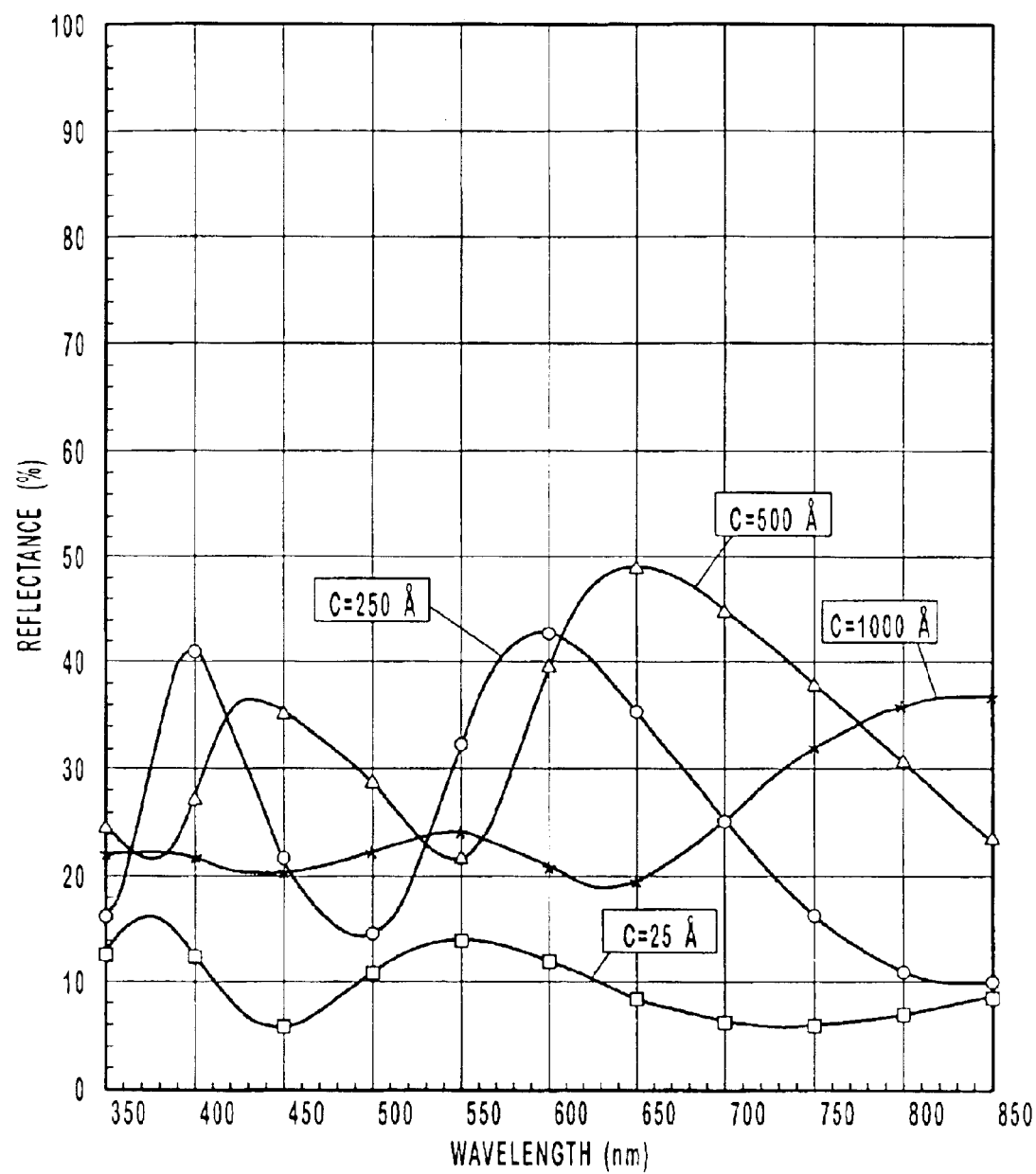
FIG. 5 is a graph plotting the overall reflectance for various three layer color shifting interference flakes according to the present invention.

Theoretical color shifting flakes having three layer coating structures according to the present invention were developed and had the following basic coating design: PET/C/$SiO_2$/C/Air, with the $SiO_2$ layer having a 4 QWOT at 550 nm, and the carbon layers ranging in thickness from 25 Å up to 1,000 Å. Four different flake structures with carbon layers having thicknesses of 25 Å, 250 Å, 500 Å, and 1,000 Å, respectively, were evaluated by plotting the overall reflectance vs. wavelength of incident light. FIG. 5 is a graph showing the reflectance characteristics of each of the four flake structures at varying wavelengths of incident light. As shown in the graph of FIG. 5, while all of the flake structures had at least some color shift, the optimum carbon thickness appears to be 250 Å when a silica dielectric layer is used. Although the overall reflectance is for the designs on a PET substrate, these designs will have a similar reflectance if placed in a polymeric medium when the medium is on both sides of the optical stack.

EXAMPLE 4

Figure 6:
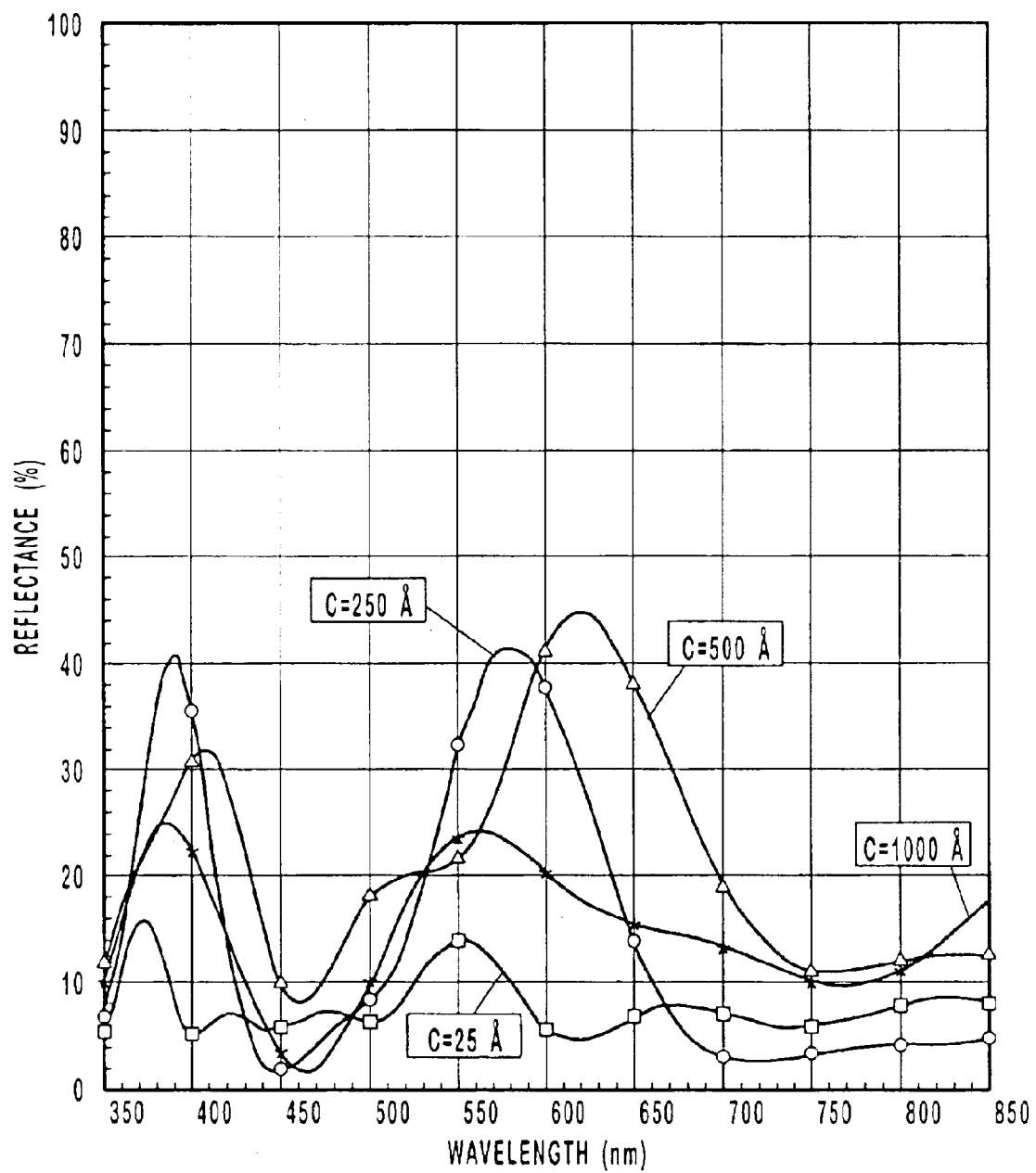
FIG. 6 is a graph plotting the overall reflectance for various five layer color shifting interference flakes according to the present invention.

Theoretical color shifting flakes having five layer coating structures according to the present invention were developed and had the following basic coating design: PET/$SiO_2$/C/$SiO_2$/C/$SiO_2$/Air, with the $SiO_2$ layers having a 4 QWOT at 550 nm, and the carbon layers ranging in thickness from 25 Å up to 1,000 Å. Four different flake structures with carbon layers having thicknesses of 25 Å, 250 Å, 500 Å, and 1,000 Å, respectively, were evaluated by plotting the overall reflectance vs. wavelength of incident light. FIG. 6 is a graph showing the reflectance characteristics of each of the four flake structures at varying wavelengths of incident light. As shown in the graph of FIG. 6, while all of the flake structures had at least some color shift, the optimum carbon thickness appears to be 250 Å when silica dielectric layers are used.

EXAMPLE 5

Figure 7:
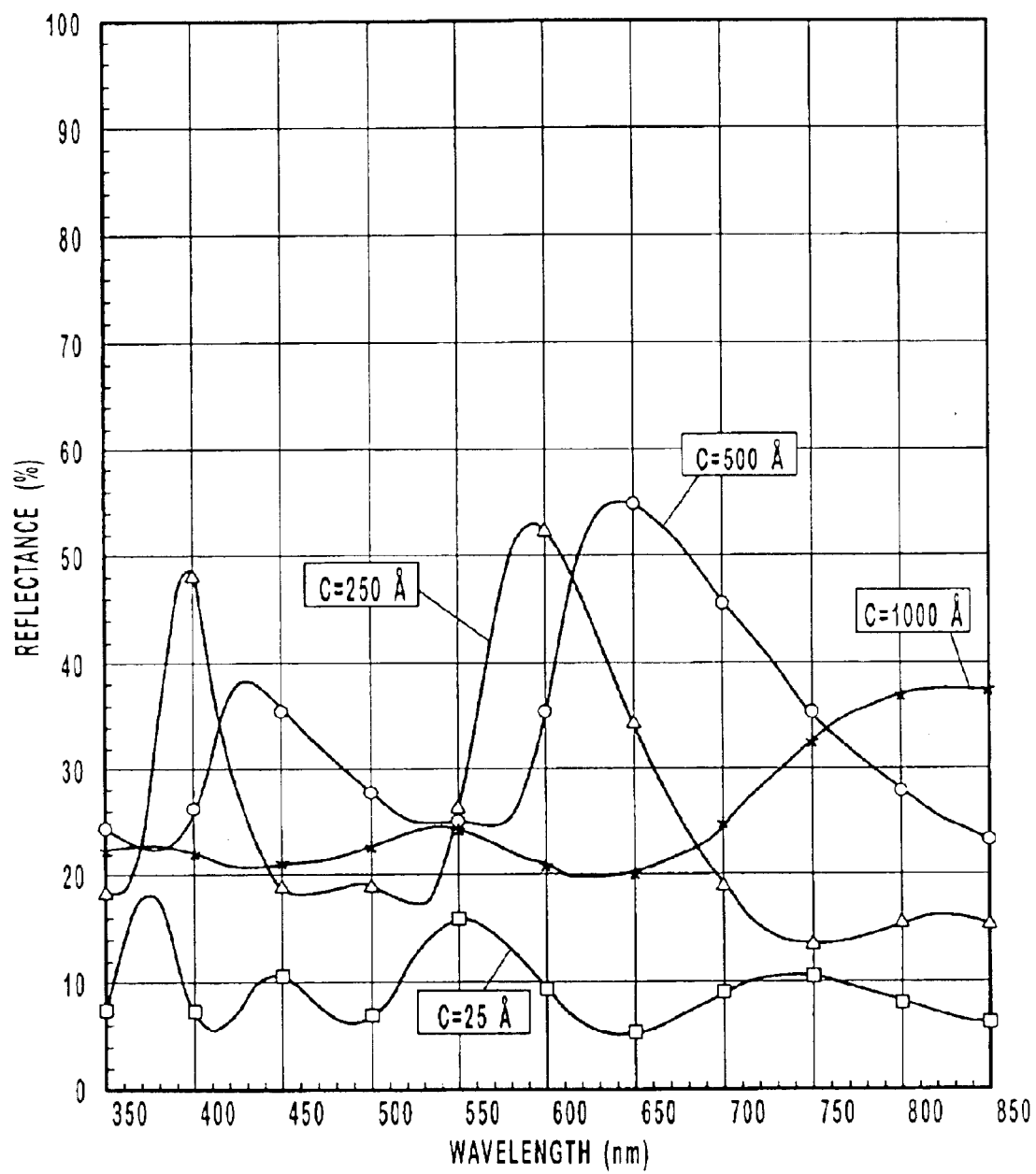
FIG. 7 is a graph plotting the overall reflectance for various five layer color shifting interference flakes according to the present invention.

Theoretical color shifting flakes having five layer coating structures according to the present invention were developed and had the following basic coating design: PET/C/$SiO_2$/C/$SiO_2$/C/Air, with the $SiO_2$ layers having a 4 QWOT at 550 nm, and the carbon layers ranging in thickness from 25 Å up to 1,000 Å. Four different flake structures with carbon layers having thicknesses of 25 Å, 250 Å, 500 Å, and 1,000 Å, respectively, were evaluated by plotting the overall reflectance vs. wavelength of incident light. FIG. 7 is a graph showing the reflectance characteristics of each of the four flake structures at varying wavelengths of incident light. As shown in the graph of FIG. 7, while all of the flake structures had at least some color shift, the optimum carbon thickness appears to be 250 Å when silica dielectric layers are used.

The refractive index data that was used to theoretically calculate the reflectance curves in FIGS. 5, 6, and 7 discussed above is given in Tables 1 and 2 below, where n is the real part of the refractive index and k is the extinction coefficient (i.e., imaginary part of the refractive index). The extinction coefficient is related to the absorption coefficient ($\alpha$) by the following relationship: $k=\alpha\lambda/4\pi$, where $\lambda$ is the vacuum wavelength.

TABLE 1

| Carbon Wavelength (nm) | n | k |
|---|---|---|
| 350 | 1.75 | 1.20 |
| 400 | 2.00 | 1.15 |
| 450 | 2.15 | 1.10 |
| 500 | 2.40 | 1.00 |
| 600 | 2.55 | 0.95 |
| 800 | 2.65 | 1.00 |

The $SiO_2$ index was taken to be as follows:

TABLE 2

| $SiO_2$ Wavelength (nm) | n | k |
|---|---|---|
| 380 | 1.47 | 0.00 |
| 436 | 1.47 | 0.00 |
| 480 | 1.46 | 0.00 |
| 656 | 1.46 | 0.00 |
| 805 | 1.45 | 0.00 |

Based on the disclosure herein, it will be readily apparent to one having ordinary skill in the art of optical thin film design and deposition to appropriately modify the carbon layer thickness in the manner described in Examples 1 through 5, when the deposited carbon has a different refractive index and absorption coefficient than that disclosed in Example 5.

EXAMPLE 6

Figure 8:
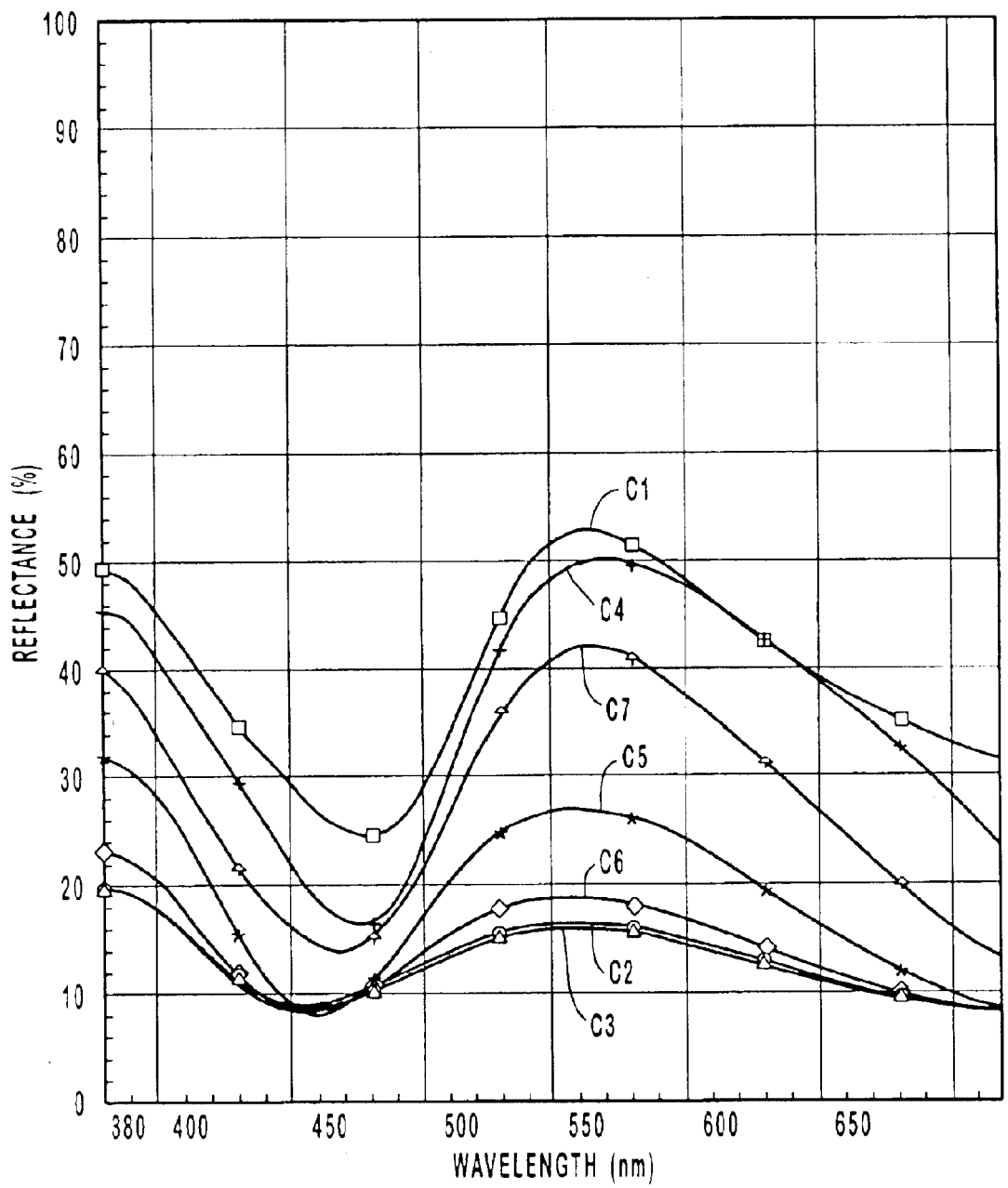
FIG. 8 is a graph plotting the overall reflectance for various three layer color shifting interference flakes according to the present invention.

The significance of the carbon compounds having different refractive indexes and dispersion values was illustrated by modeling the simplest coating design structure, carbon/dielectric/carbon. FIG. 8 is a graph showing the reflectance characteristics of this design structure with various forms of carbon at varying wavelengths of incident light. The range of optical constants for the various forms of carbon are summarized in Tables 3–9 below. In particular, FIG. 8 illustrates a theoretical performance for coating designs of the type $C/SiO_2/C$ wherein the carbon has a physical thickness of 30 nm and the $SiO_2$ has a physical thickness of about 350 nm (i.e., four quarter waves optical thickness for the reference wavelength of 508 nm).

The curve labeled C1 in FIG. 8, which corresponds to graphite with the optical constants listed in Table 3, has the greatest dynamic range of overall reflection, and will exhibit the largest observable color shift in reflection. At normal incidence, the design reflects 560 nm, a green color, and deletes the shifts toward shorter wavelengths (blue reflected color) as the angle of incident light increases.

Other forms of carbon such as diamond-like carbon, illustrated by curves C2 and C3 in FIG. 8 with corresponding optical constants listed in Table 4 and 5, wherein the absorption coefficient is low, i.e., less than about 0.1, exhibit a low dynamic color range as well as a gradual peak slope between the overall reflection minimum, at about 450 nm, and the maximum at 508 nm. This results in less color and color shift being exhibited with increases in angle of incidence.

The additional forms of carbon illustrated by curves C4–C7 in FIG. 8, with corresponding optical constants listed in Tables 6–9, show an intermediate dynamic range of overall reflection spread between curves C1 and C2, C3.

TABLE 3

Graphite (C1)

| Wavelength (nm) | Refractive Index | Absorption Coefficient |
|---|---|---|
| 413 | 2.62 | 1.28 |
| 516.6 | 2.66 | 1.33 |
| 729.3 | 3.01 | 1.84 |

TABLE 4

Diamond-like Carbon[1] (C2)

| Wavelength (nm) | Refractive Index | Absorption Coefficient |
|---|---|---|
| 550 | 1.76 | 0.04 |

[1]Assumes no dispersion in refractive index and absorption coefficient.

TABLE 5

Diamond-like Carbon (C3)

| Wavelength (nm) | Refractive Index | Absorption Coefficient |
|---|---|---|
| 413.3 | 1.76 | 0.061 |
| 708.6 | 1.74 | 0.0057 |

TABLE 6

Amorphous hydrogenated diamond-like carbon (C4)

| Wavelength (nm) | Refractive Index | Absorption Coefficient |
|---|---|---|
| 400 | 2.408 | 0.853 |
| 550 | 2.672 | 0.717 |
| 700 | 2.815 | 0.579 |

TABLE 7

Ion Assisted Carbon I (C5)

| Wavelength (nm) | Refractive Index | Absorption Coefficient |
|---|---|---|
| 400 | 2.007 | 0.242 |
| 550 | 2.029 | 0.121 |
| 700 | 2.019 | 0.062 |

TABLE 8

Ion Assisted Carbon II (C6)

| Wavelength (nm) | Refractive Index | Absorption Coefficient |
|---|---|---|
| 400 | 1.831 | 0.121 |
| 550 | 1.83 | 0.045 |
| 700 | 1.822 | 0.021 |

TABLE 9

Arc Evaporated Carbon (C7)

| Wavelength (nm) | Refractive Index | Absorption Coefficient |
|---|---|---|
| 413.3 | 2.11 | 0.90 |
| 563.6 | 2.38 | 0.82 |
| 774.9 | 2.33 | 0.71 |

The present invention may be embodied in other specific forms without departing from its spirit or essential characteristics. The described embodiments are to be considered in all respects only as illustrative and not restrictive. The scope of the invention is, therefore, indicated by the appended claims rather than by the forgoing description. All changes which come within the meaning and range of equivalency of the claims are to be embraced within their scope.

What is claimed is:

1. A color shifting interference structure, comprising:
a first dielectric layer;
a first carbon layer overlying the first dielectric layer;
a second dielectric layer overlying the first carbon layer;
a second carbon layer overlying the second dielectric layer; and
a third dielectric layer overlying the second carbon layer;
wherein the dielectric layers have an optical thickness at a design wavelength that provides a color shift as the angle of incident light or viewing angle changes.

2. The interference structure of claim 1, wherein the dielectric layers each have an optical thickness from about 2 QWOT to about 9 QWOT at a design wavelength from about 400 nm to about 700 nm.

3. The interference structure of claim 1, wherein the first, second, and third dielectric layers have the same optical thickness.

4. The interference structure of claim 1, wherein the first, second, and third dielectric layers have an index of refraction from about 1.38 to about 2.3.

5. The interference structure of claim 1, wherein the first, second, and third dielectric layers comprise a material selected from the group consisting of silicon monoxide, silicon dioxide, and combinations thereof.

6. The interference structure of claim 1, wherein the first, second, and third dielectric layers are composed of the same material.

7. The interference structure of claim 1, wherein the first and third dielectric layers form a substantially continuous coating surrounding the first and second carbon layers.

8. The interference structure of claim 7, wherein the first and second carbon layers form a substantially continuous coating surrounding the second dielectric layer.

9. The interference structure of claim 1, wherein the interference structure is a foil.

10. The interference structure of claim 1, wherein the foil comprises a hot stamp foil.

11. The interference structure of claim 1, wherein the interference structure comprises a pigment flake.

12. A method of fabricating a color shifting interference structure, comprising:

forming a first dielectric layer over an upper surface of a web material;

forming a first carbon layer over the first dielectric layer;

forming a second dielectric layer over the first carbon layer to form an interference film; and removing the interference film from the web material in order to produce a plurality of multilayer interference flakes or foils.

13. The method of claim 12, further comprising forming a second carbon layer over the second dielectric layer, and forming a third dielectric layer over the second carbon layer prior to removing the interference film from the web material.

14. The method of claim 12, further comprising mixing the interference flakes with a pigment medium.

15. The method of claim 12, further comprising coating the interference flakes with a second carbon layer that substantially surrounds both of the first and second dielectric layers.

16. The method of claim 12, further comprising coating the interference flakes with a third dielectric layer substantially surrounds both of the first and second dielectric layers, wherein the third dielectric layer has a refractive index that is different from the refractive index of the first and second dielectric layers.

* * * * *